(12) United States Patent
Lu et al.

(10) Patent No.: US 12,433,025 B2
(45) Date of Patent: Sep. 30, 2025

(54) DISPLAY PANEL AND DISPLAY APPARATUS INCLUDING DUMMY CONDUCTIVE PATTERN

(71) Applicant: Innolux Corporation, Miao-Li County (TW)

(72) Inventors: You-Cheng Lu, Miao-Li County (TW); Chia-Hao Tsai, Miao-Li County (TW); Yung-Hsun Wu, Miao-Li County (TW); Wei-Yen Chiu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 598 days.

(21) Appl. No.: 17/870,868

(22) Filed: Jul. 22, 2022

(65) Prior Publication Data

US 2023/0047640 A1 Feb. 16, 2023

(30) Foreign Application Priority Data

Aug. 16, 2021 (CN) .......................... 202110938258.6

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01); *H10D 86/481* (2025.01)

(58) Field of Classification Search
CPC .... H10D 86/60; H10D 86/441; H10D 86/481; H10D 10/821; H10D 64/511; H10K 59/131; H10K 59/88
See application file for complete search history.

(56) References Cited

U.S. PATENT DOCUMENTS

| 10,354,578 | B2 * | 7/2019 | Ka ........... G09G 3/2092 |
| 11,100,858 | B2 * | 8/2021 | An ........... G09G 3/3233 |
| 2010/0053058 | A1 * | 3/2010 | Nagashima ....... G09G 3/36 345/98 |
| 2018/0129106 | A1 * | 5/2018 | Gao ........... G02F 1/13781 |
| 2018/0145093 | A1 * | 5/2018 | Xi ........... H10D 30/673 |
| 2018/0342572 | A1 * | 11/2018 | Park ........... H10K 59/123 |

(Continued)

FOREIGN PATENT DOCUMENTS

| CN | 110492018 | 11/2019 | |
| WO | WO-2020085592 A1 * | 4/2020 | ........... G09G 3/3233 |

OTHER PUBLICATIONS

"Office Action of Taiwan Counterpart Application", issued on Feb. 3, 2023, p. 1-p. 5.

*Primary Examiner* — Ida M Soward
(74) *Attorney, Agent, or Firm* — JCIPRNET

(57) ABSTRACT

A display panel and a display apparatus are disclosed. The display apparatus includes the display panel and a sensing device. The display panel includes a substrate, a first signal line, and a first dummy conductive pattern. The substrate includes a functional display region, a buffer region, and a general display region. The buffer region is located between the functional display region and the general display region. The first signal line and the first dummy conductive pattern are disposed on the substrate and correspond to the buffer region. The first dummy conductive pattern is overlapped with a part of the first signal line. The sensing device is overlapped with the functional display region.

20 Claims, 11 Drawing Sheets

(56) References Cited

U.S. PATENT DOCUMENTS

| | | | |
|---|---|---|---|
| 2019/0109184 A1* | 4/2019 | Li | G06F 1/163 |
| 2019/0385510 A1* | 12/2019 | Kim | H10K 59/1315 |
| 2020/0117313 A1* | 4/2020 | Zhang | G06F 3/0446 |
| 2020/0258973 A1 | 8/2020 | Park et al. | |
| 2021/0327362 A1* | 10/2021 | Park | H10K 59/123 |
| 2022/0392964 A1* | 12/2022 | Wu | H10K 59/65 |

* cited by examiner

DISPLAY PANEL AND DISPLAY APPARATUS INCLUDING DUMMY CONDUCTIVE PATTERN

CROSS-REFERENCE TO RELATED APPLICATION

This application claims the priority benefit of Chinese application no. 202110938258.6, filed on Aug. 16, 2021. The entirety of the above-mentioned patent application is hereby incorporated by reference herein and made a part of this specification.

BACKGROUND

Technical Field

The disclosure relates to a panel and an apparatus. In particular, the disclosure relates to a display panel and a display apparatus.

Description of Related Art

Compared with digging holes on a display panel to accommodate a camera module, disposing the camera module under the display panel effectively reduces the border or helps increase the size of a display region. However, the design of lead wires connected to pixels in a general display region and a display region provided with the camera module may cause the display quality to be reduced because of unevenness of loads (e.g., a resistance or a capacitance).

SUMMARY

The disclosure provides a display panel and a display apparatus helping improve load unevenness.

According to an embodiment of the disclosure, a display panel includes a substrate, a first signal line, and a first dummy conductive pattern. The substrate includes a functional display region, a buffer region, and a general display region. The buffer region is located between the functional display region and the general display region. The first signal line and the first dummy conductive pattern are disposed on the substrate and correspond to the buffer region. The first dummy conductive pattern is overlapped with a part of the first signal line.

According to an embodiment of the disclosure, a display apparatus includes a display panel and a sensing device. The display panel includes a substrate, a first signal line, and a first dummy conductive pattern. The substrate includes a functional display region, a buffer region, and a general display region. The buffer region is located between the functional display region and the general display region. The first signal line and the first dummy conductive pattern are disposed on the substrate and correspond to the buffer region. The first dummy conductive pattern is overlapped with a part of the first signal line. The sensing device is overlapped with the functional display region.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
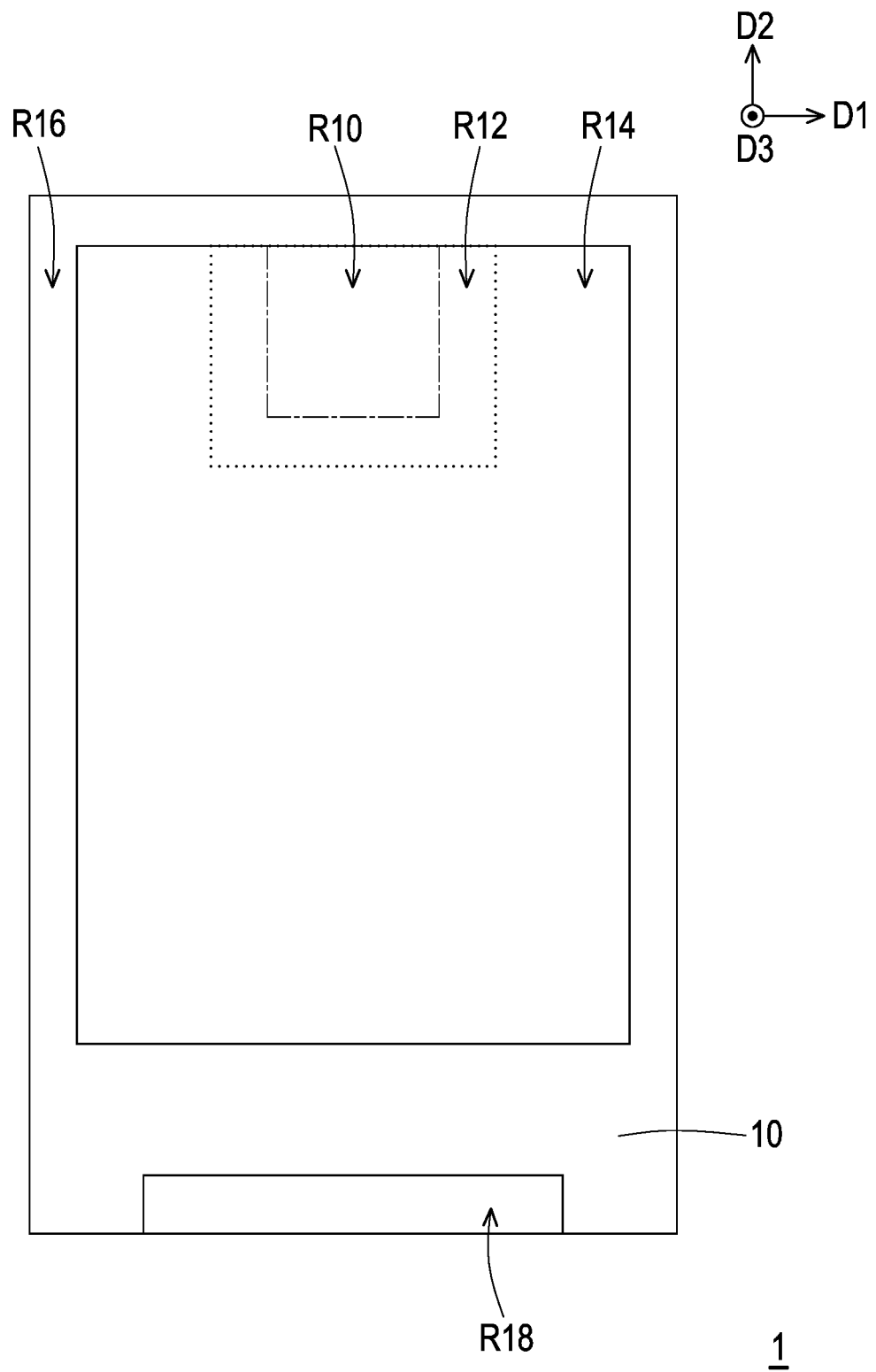
FIG. 1 is a schematic top view of a display panel according to some embodiments of the disclosure.

The disclosure may be understood with reference to the following detailed description together with the accompanying drawings. It should be noted that, for ease of understanding by readers and conciseness of the drawings, a plurality of drawings in the disclosure merely show a part of an electronic device, and specific elements in the drawings are not drawn to scale. In addition, the number and size of the elements in the drawings only serve for exemplifying instead of limiting the scope of the disclosure For example, the relative sizes, thicknesses, and positions of film layers, regions, or structures may be reduced or enlarged for clarity.

Some terms are used to refer to specific elements throughout the specification and the appended claims in the disclosure. A person skilled in the art should understand that an electronic device manufacturer may use different names to refer to the same elements. This specification is not intended to distinguish elements that have the same functions but different names. In this specification and the claims hereinafter, terms such as "include", "comprise", and "have' are open-ended terms, and should thus be interpreted as "including, but not limited to".

The directional terms mentioned herein, like "above", "below", "front", "back', "left", "right", and the like, refer only to the directions in the accompanying drawings. Therefore, the directional terms are used for describing instead of limiting the disclosure. It should be understood that when an element or film layer is referred to as being disposed "on", or "connected to" another element or film layer, the element or film layer may be directly on or connected to the another element or film layer, or intervening elements or film layers may also be present in between (non-direct circumstances). In contrast, when an element or film layer is referred to as being "directly on" or "directly connected to" another element or film layer, no intervening elements or film layers are present in between.

The terms "equal to" or "same" mentioned herein typically represents that a value is within 10% of a given value or range, or within 5%, 3%, 2%, 1%, or 0.5% of a given value or range. In addition, the description "a given range is from a first value to a second value" or "a given range falls within a range of a first value to a second value" indicates that the given range includes the first value, the second value, and other values in between.

In some embodiments of the disclosure, terms related to bonding and connection such as "connection", "interconnection", etc., unless specifically defined, may indicate the case where two structures are in direct contact, or where two structures are not in direct contact and other structures are arranged in between. Such terms related to bonding and connection may also cover the case where two structures are both movable or where two structures are both fixed. Moreover, the terms "electrically connection", or "coupling" includes any direct and indirect electrical connection means. Furthermore, terms such as "first" and "second" mentioned in this specification or claims are used only for naming discrete elements or to differentiate among different embodiments or ranges, rather than limiting an upper bound or a lower bound of the number of elements, nor limiting the manufacturing sequence or arrangement sequence of elements.

In the disclosure, an electronic device may include a display device, an antenna device, a sensing device, a light-emitting device, a touch display, a curved display, or a free shape display, but not limited thereto. The electronic device may be a bendable or flexible electronic device. The electronic device may include, for example but not limited to, a liquid crystal, a light-emitting diode (LED), a quantum dot (QD), fluorescence, phosphor, or other suitable display media or a combination thereof. The light-emitting diode may include, for example but not limited to, an organic light-emitting diode (OLED), a mini LED, a micro LED, a quantum dot (QD) LED (e.g., QLED or QDLED), or other suitable materials or a combination thereof. The display device may include a tiled display device, for example but not limited thereto. The antenna device may be a liquid crystal antenna, for example but not limited thereto. The antenna device may include a tiled antenna device, for example but not limited thereto. It should be noted that the electronic device may be any arrangement or combination of the above, but is not limited thereto. In addition, the electronic device may have a shape of a rectangle, a circle, or a polygon, a shape with curved edges, or other suitable shapes. The electronic device may have peripheral systems such as a driving system, a control system, a light source system, or the like to support the display device, the antenna device, or the tiled device. Hereinafter, a display panel will be taken as the electronic device to describe the content of the disclosure, but the disclosure is not limited thereto.

The display apparatus may include a display panel to provide a display picture. The display panel may be a display panel in any form, such as a self-luminous display panel or a non-self-luminous display panel. The self-luminous display panel may include a light emitting diode, a light conversion layer, or other suitable materials or a combination thereof, but not limited thereto. The light emitting diode may include, for example but not limited to, an organic light-emitting diode (OLED), a mini LED, a micro LED, or a quantum dot LED (e.g., QLED or QDLED). The light conversion layer may include a wavelength conversion material and/or a light filter material. The light conversion layer may include, for example but not limited to, fluorescence, phosphor, quantum dot (QD), or other suitable materials or a combination thereof. The non-self-luminous display panel may include a liquid crystal display panel, but not limited thereto. If the display panel is a non-self-luminous display panel, the display apparatus may also include a light source module. The light source module may be a light source module in any form, such as a direct-type light source module or an edge-type light source module.

In some embodiments, the display apparatus may also include a sensing device. The sensing device may include a camera, an infrared sensor, a fingerprint sensor, or the like, and the disclosure is not limited thereto. In some embodiments, the sensing device may also include a flash light, an infrared (IR) light source, other sensors, electronic components, or a combination thereof, but not limited thereto. The sensing device may be disposed under the display panel to reduce the border or increase the size of the display region, but not limited thereto. Some embodiments of the display panel accompanied with FIG. 1 to FIG. 9 are described as follows.

Figure 2:
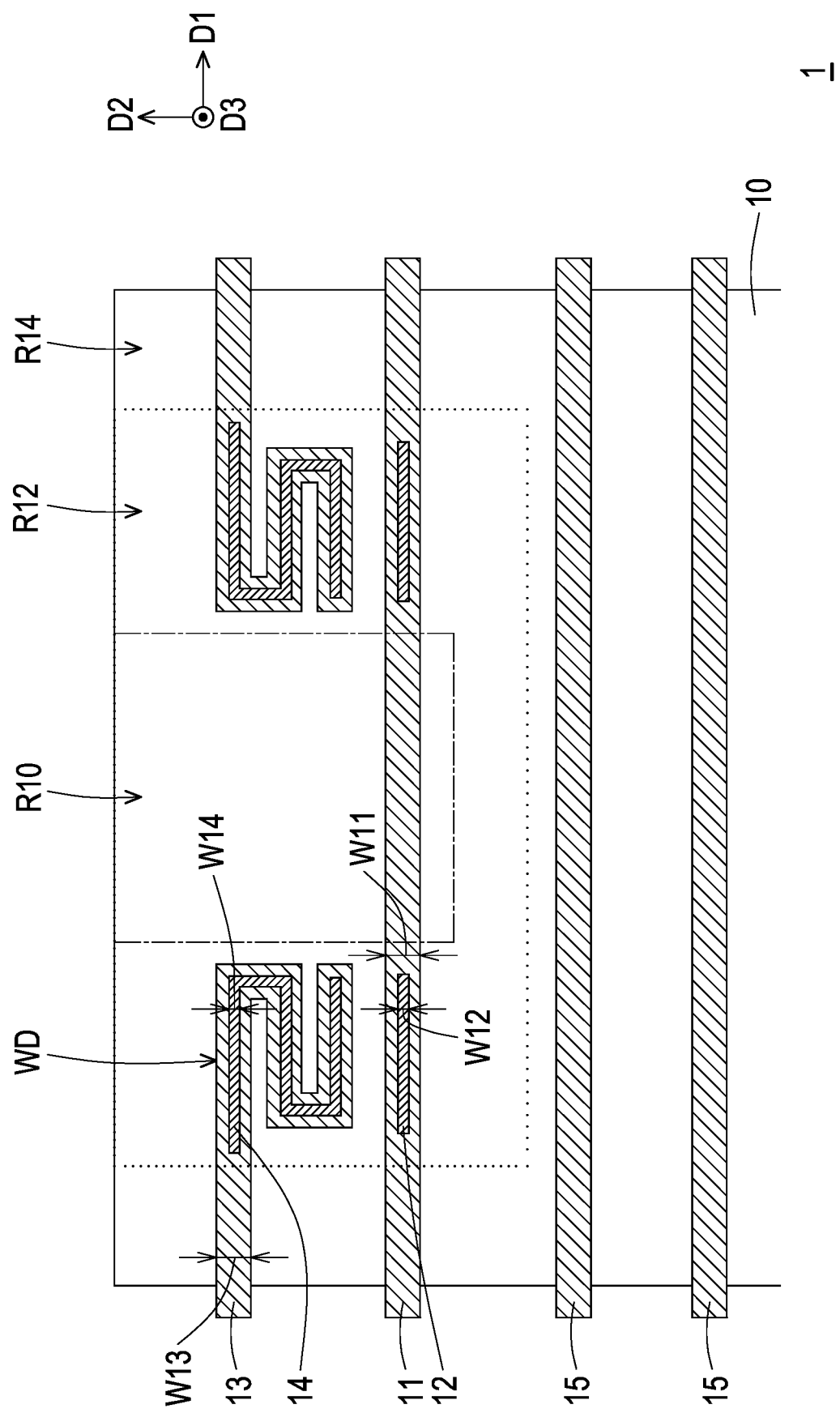
FIG. 2 to FIG. 4 are each a schematic partial top view of a display panel according to some embodiments of the disclosure.
Figure 3:
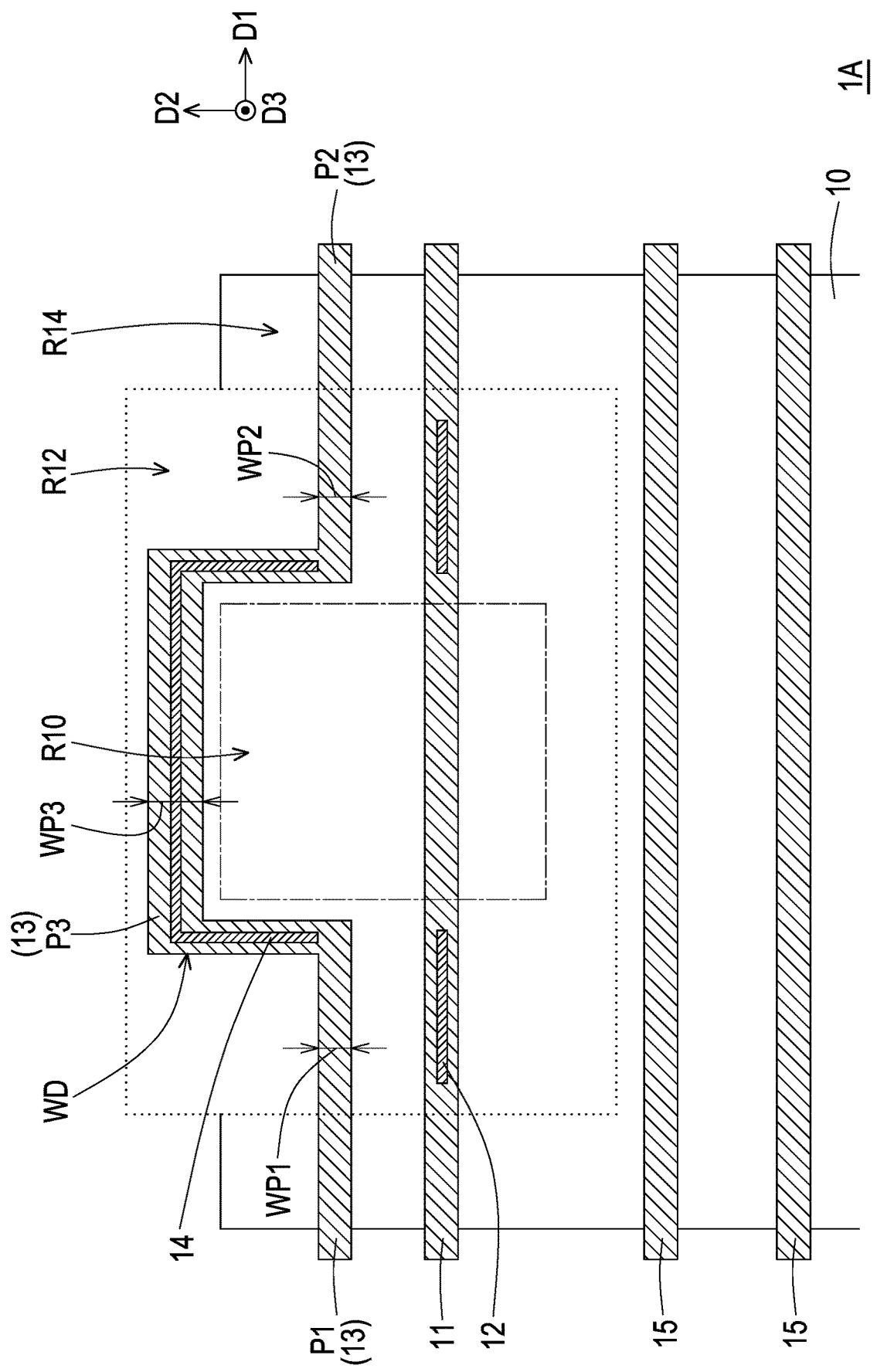
Figure 4:
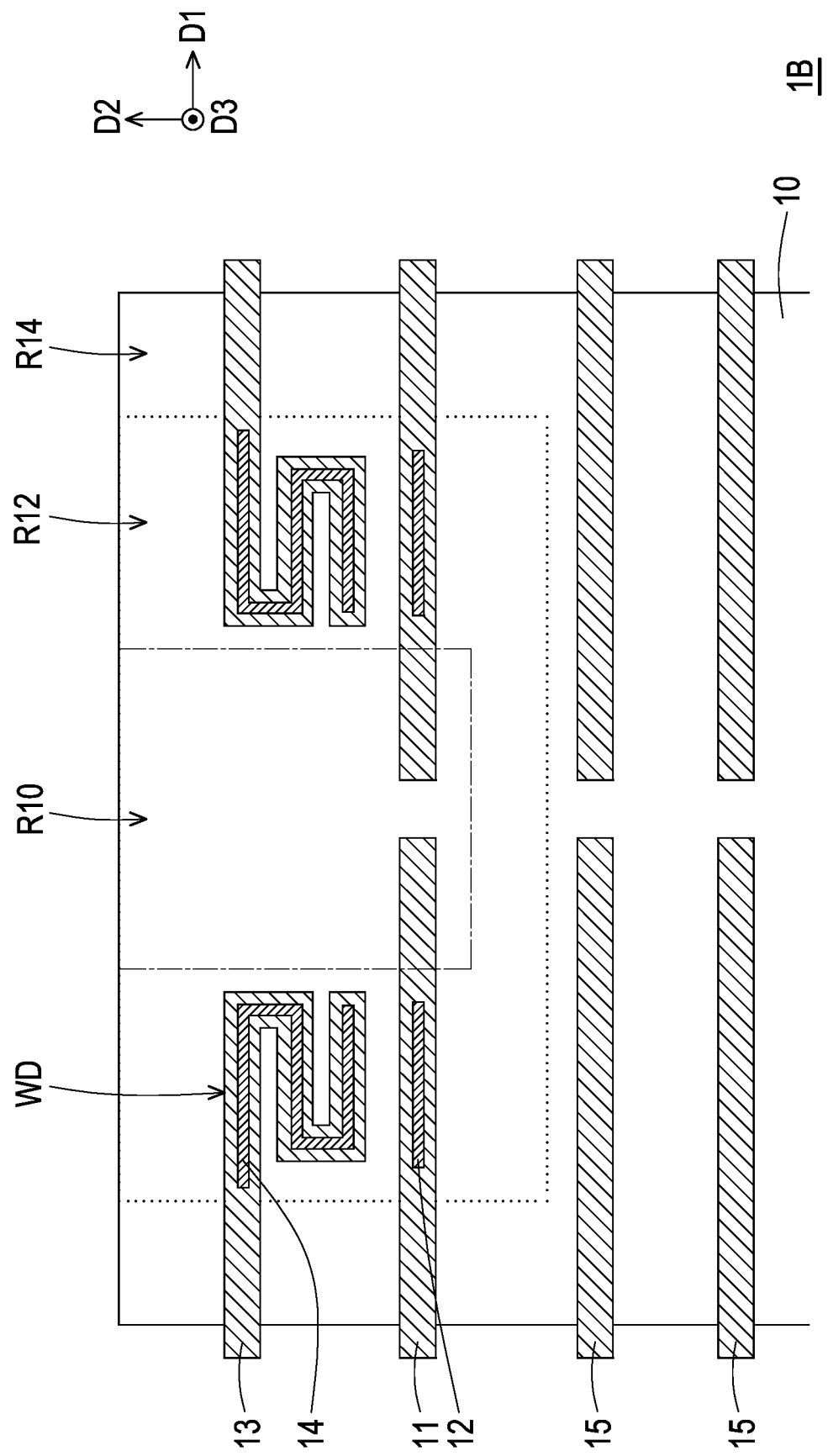
Figure 5A:
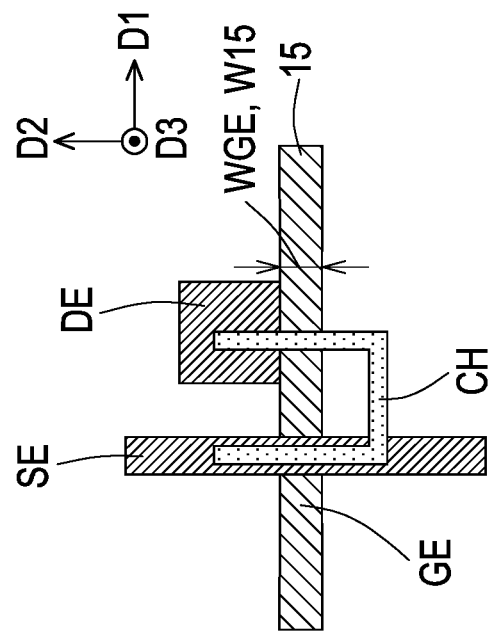
FIG. 5A is a schematic partial top view of a region corresponding to a first signal line or a second signal line.
Figure 5B:
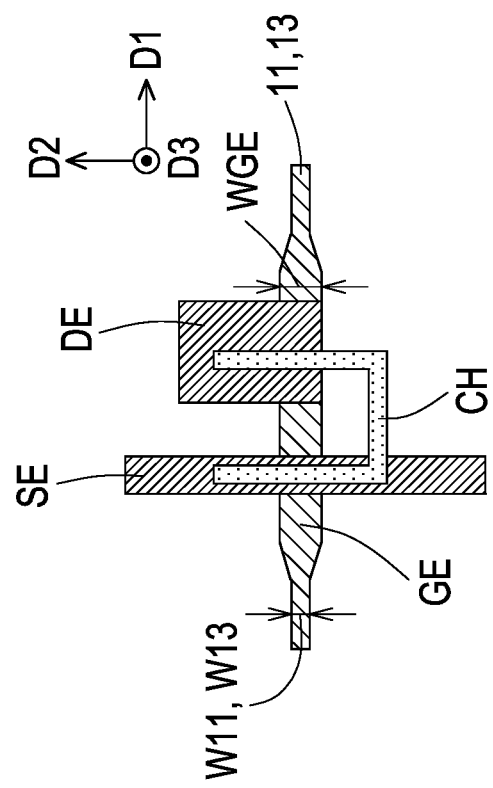
FIG. 5B is a schematic partial top view of a region corresponding to a third signal line.
Figure 6A:
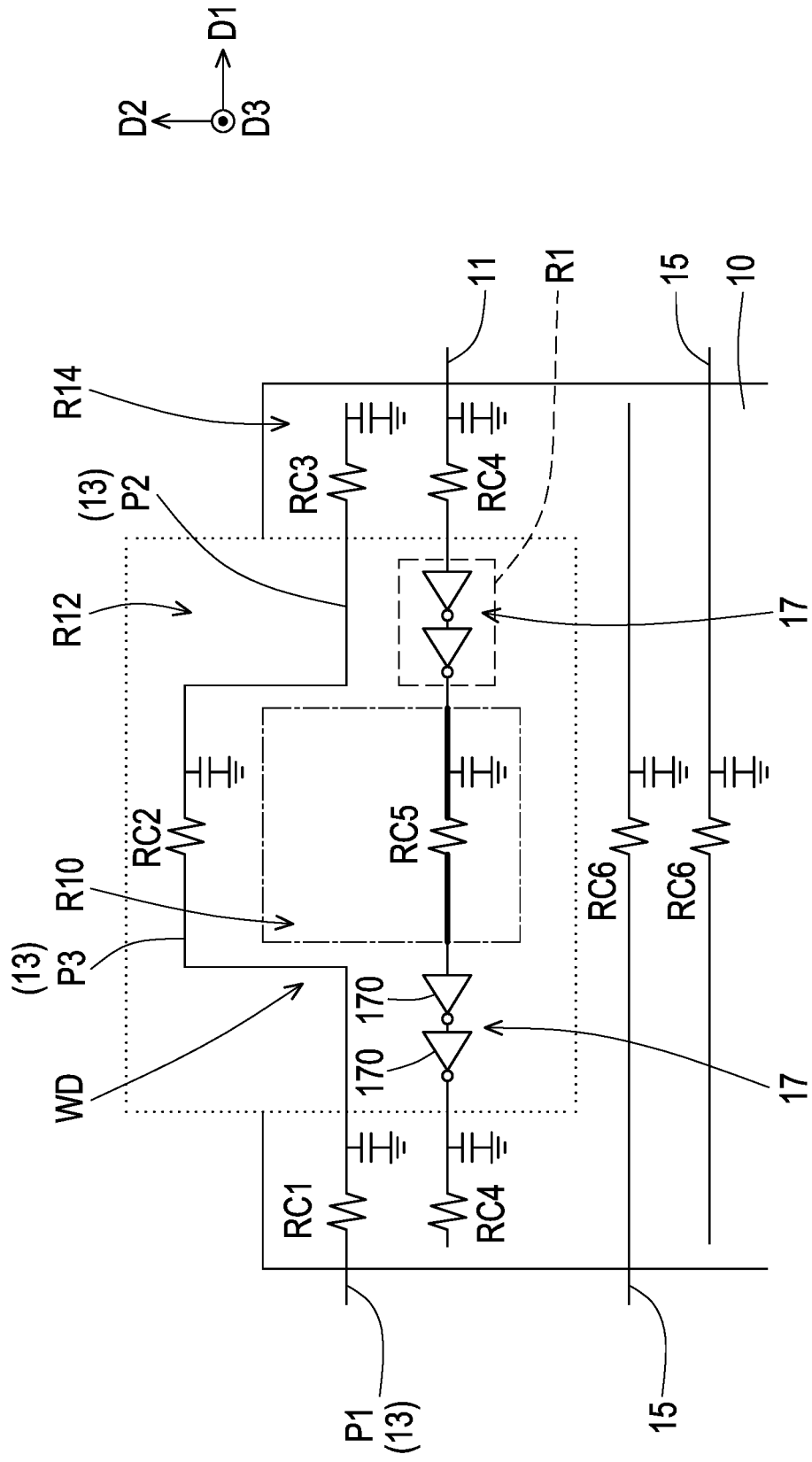
FIG. 6A is a schematic partial top view of a display panel according to some embodiments of the disclosure.
Figure 6B:
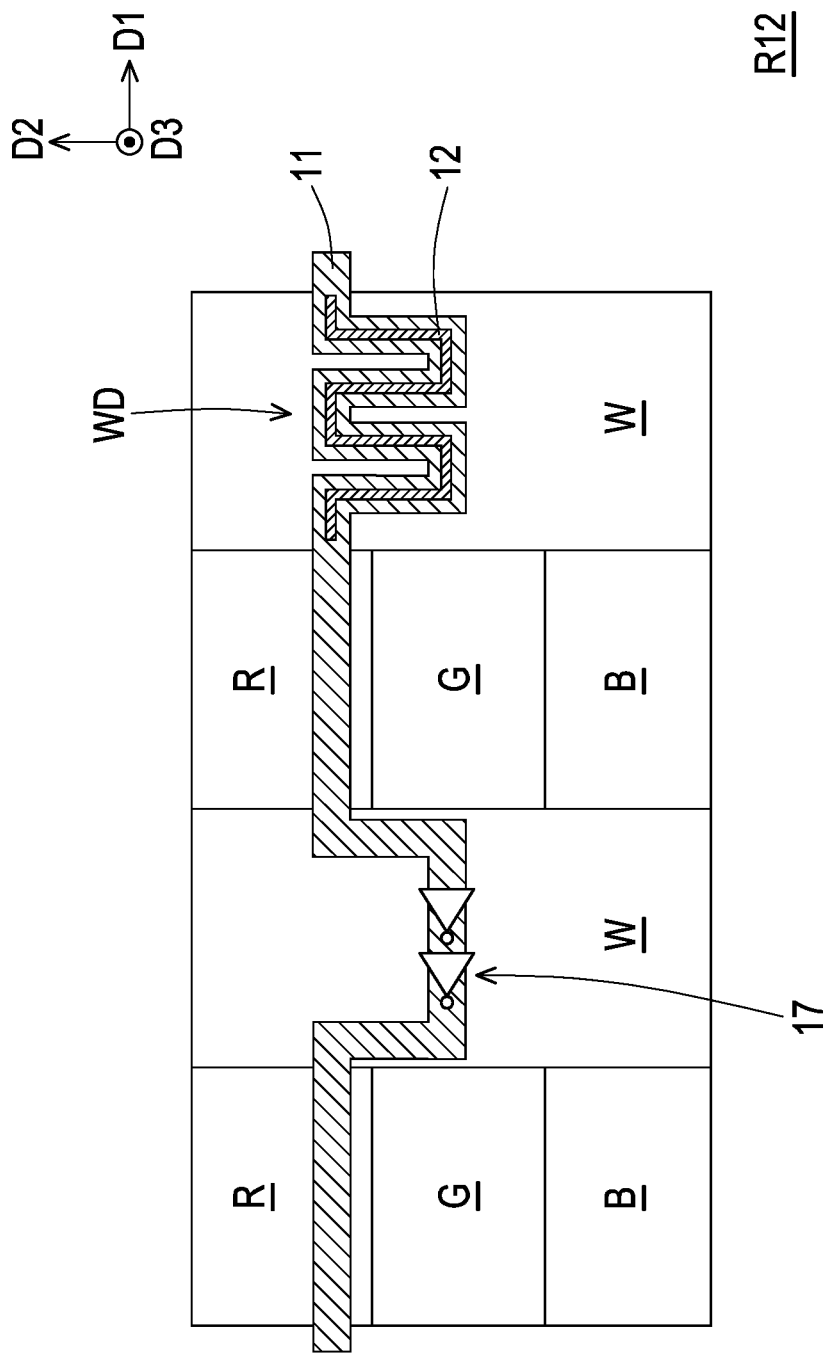
FIG. 6B is a schematic enlarged view of a region R1 in FIG. 6A.
Figure 7:
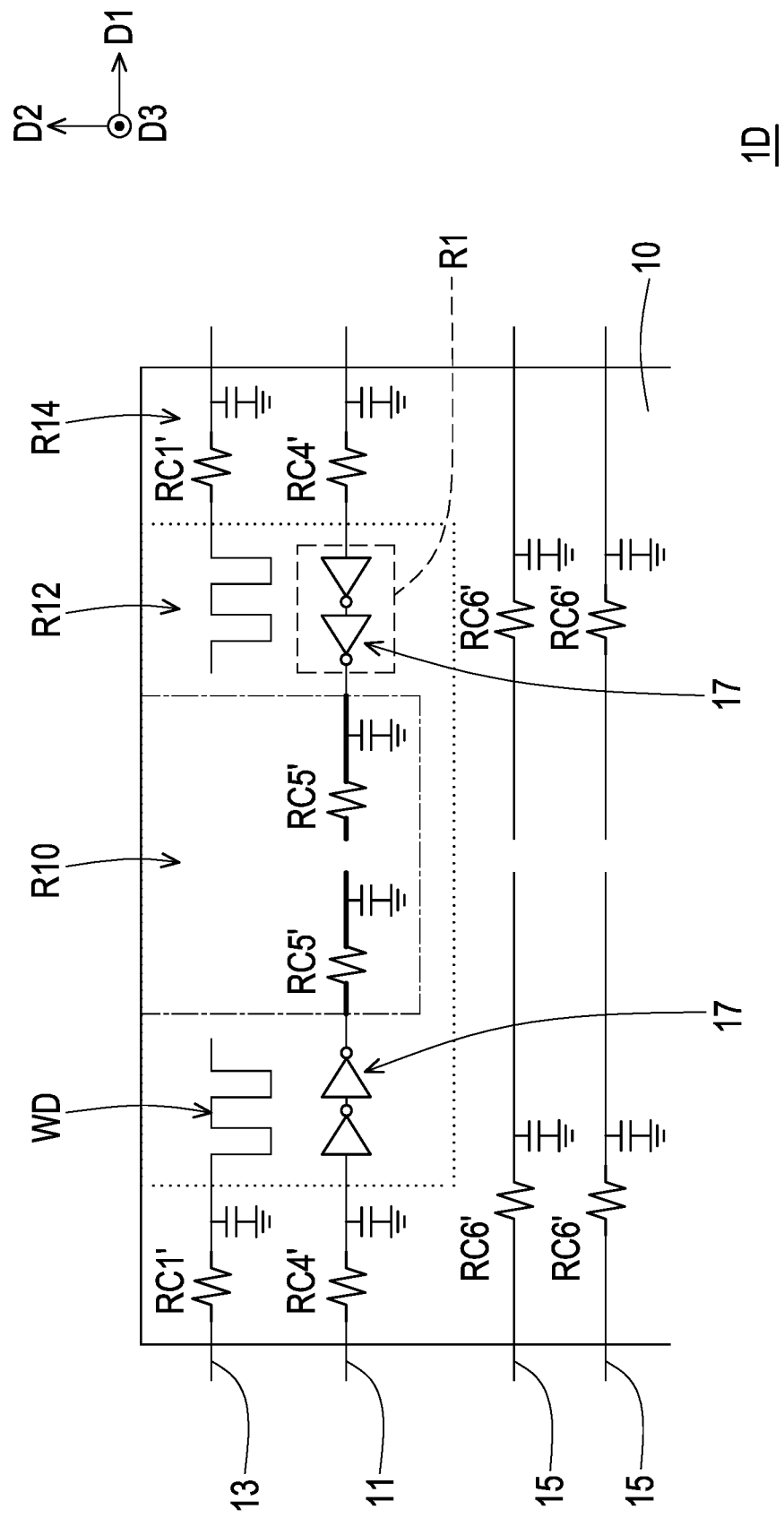
FIG. 7 and FIG. 8A are each a schematic partial top view of a display panel according to some embodiments of the disclosure.
Figure 8A:
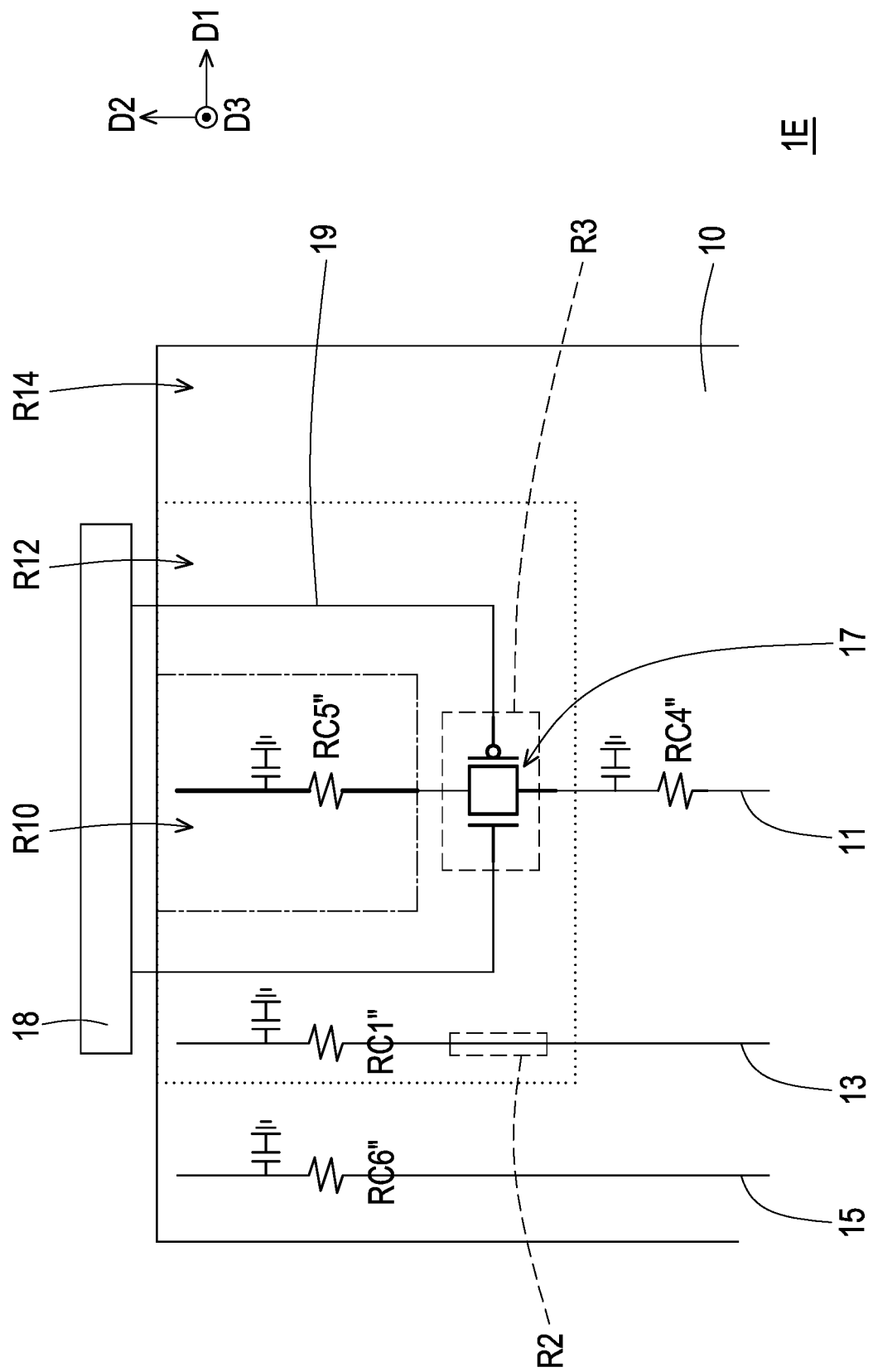
Figure 8C:
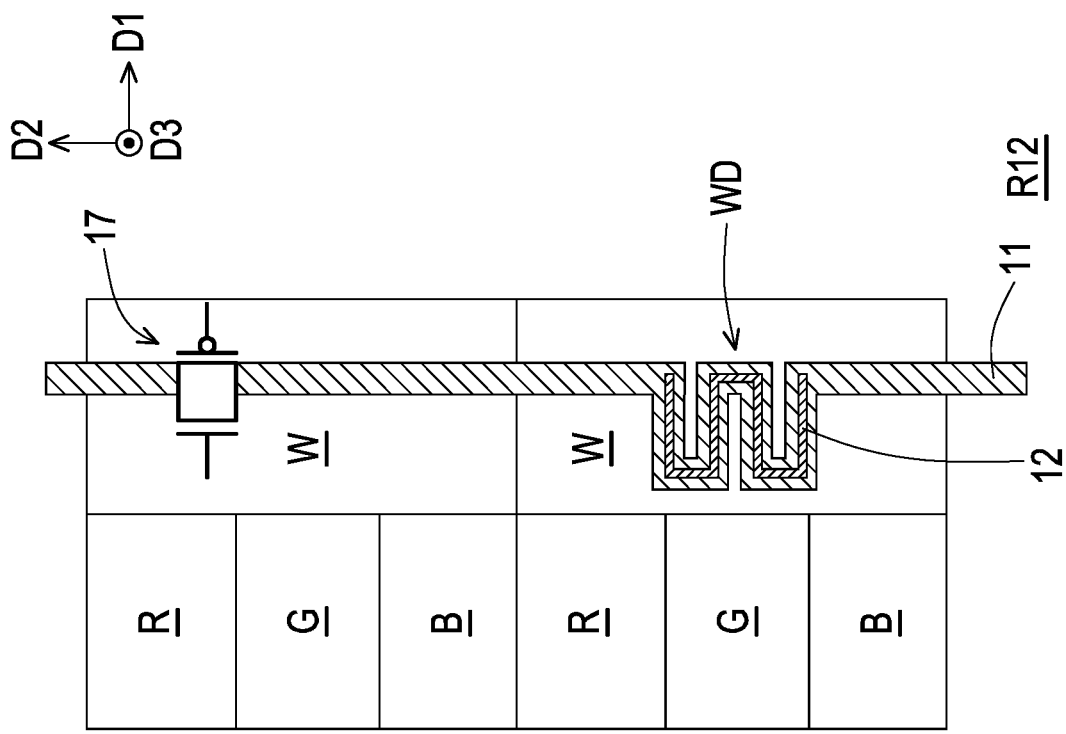
FIG. 8B and FIG. 8C are respectively schematic enlarged views of a region R2 and a region R3 in FIG. 8A.
Figure 8B:
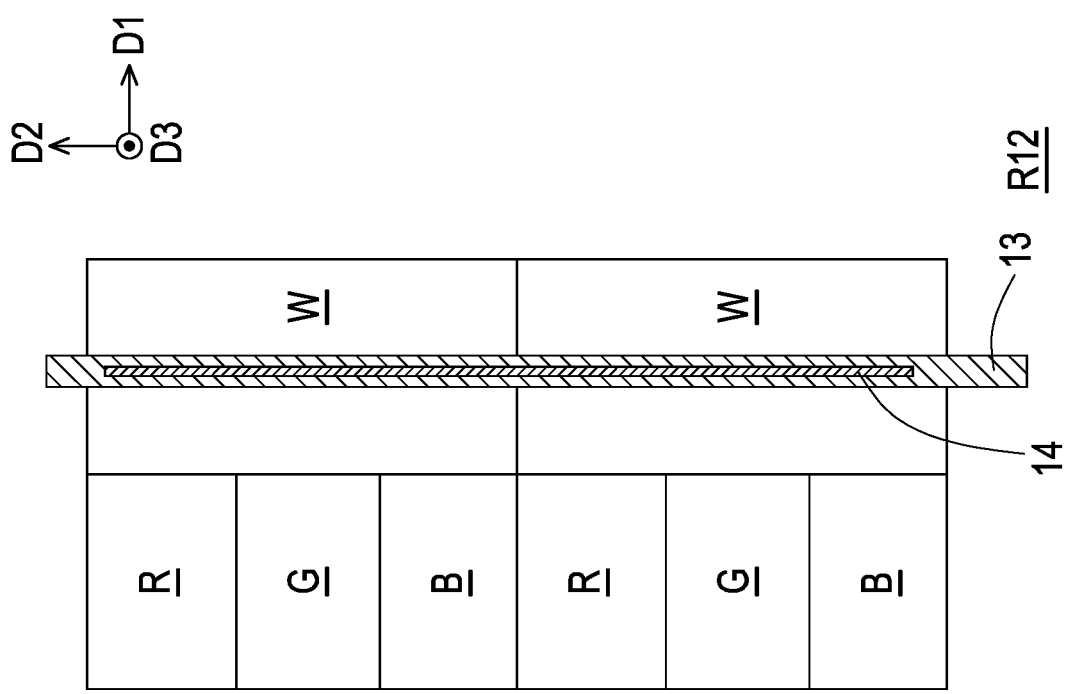
Figure 9:
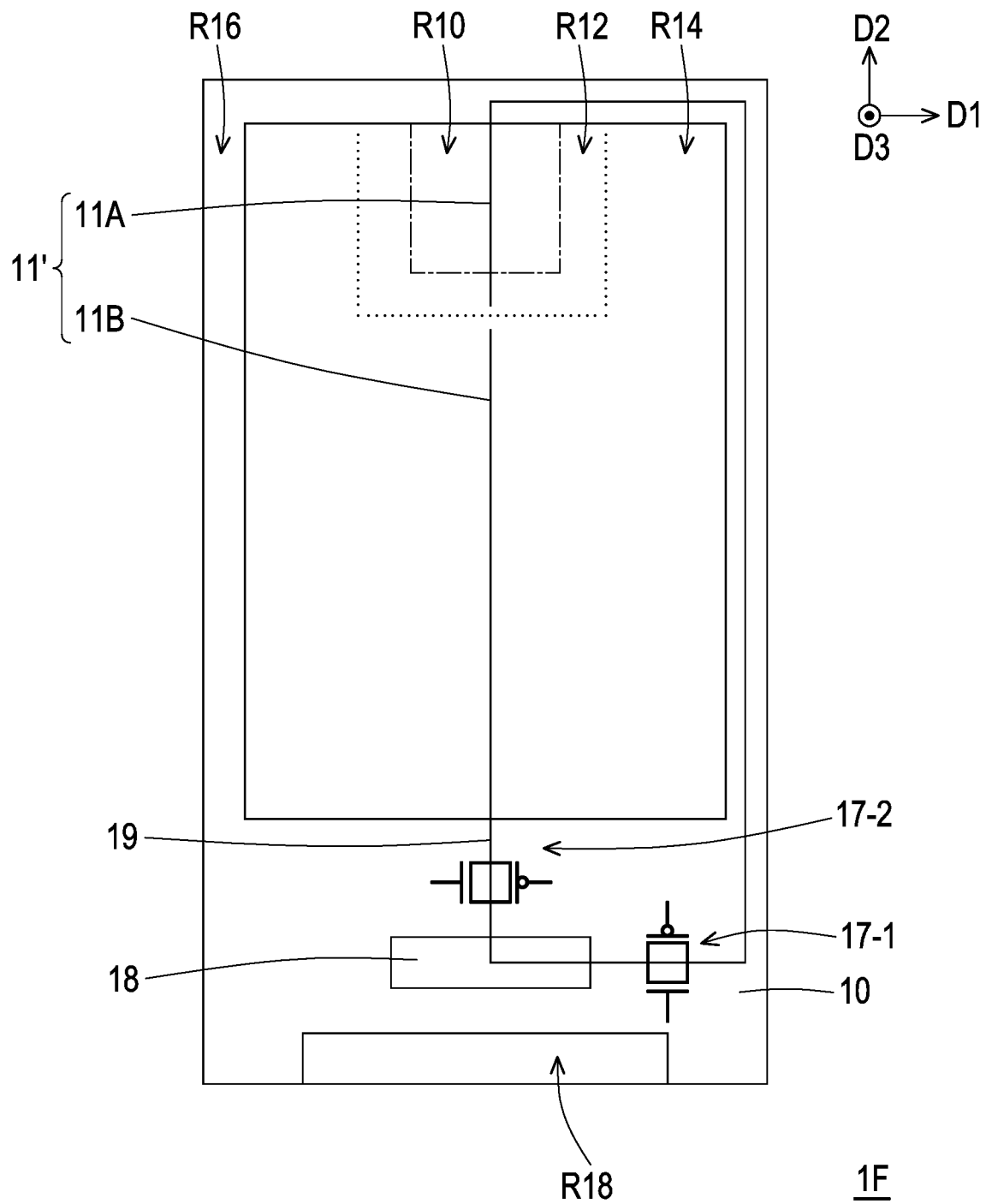
FIG. 9 is a schematic top view of a display panel according to some embodiments of the disclosure.

FIG. 1 is a schematic top view of a display panel according to some embodiments of the disclosure. FIG. 2 to FIG. 4 are each a schematic partial top view of a display panel according to some embodiments of the disclosure. FIG. 5A is a schematic partial top view of a region corresponding to a first signal line or a second signal line. FIG. 5B is a schematic partial top view of a region corresponding to a third signal line. FIG. 6A is a schematic partial top view of a display panel according to some embodiments of the disclosure. FIG. 6B is a schematic enlarged view of a region R1 in FIG. 6A. FIG. 7 and FIG. 8A are each a schematic partial top view of a display panel according to some embodiments of the disclosure. FIG. 8B and FIG. 8C are respectively schematic enlarged views of a region R2 and a region R3 in FIG. 8A. FIG. 9 is a schematic top view of a display panel according to some embodiments of the disclosure.

In the embodiments of FIG. 1 to FIG. 9, the same or similar reference numerals will be used for the same or similar elements, and repeated description thereof will be omitted. In addition, features in different embodiments may be arbitrarily mixed and used with each other provided that they do not depart from the spirit of the disclosure or conflict with each other. Moreover, simple equivalent changes and modifications made in accordance with this specification or claims still fall within the scope of the disclosure.

With reference to FIG. 1, a display panel 1 may include a substrate 10. The substrate 10 may include a functional display region R10, a buffer region R12, and a general display region R14, but not limited thereto. In the substrate 10, one or more regions may be added or reduced depending on the requirements. In some embodiments, as shown in FIG. 1, the substrate 10 may also include a peripheral region R16 and an outer pin bonding region R18, but not limited thereto.

The functional display region R10 may serve for displaying, but not limited thereto. For example, a sensing device (e.g., a camera module; not shown) in a display apparatus may be overlapped with the functional display region R10 (e.g., the sensing device may be disposed under the functional display region R10) for image shooting, video shooting, or biometric identification (e.g., fingerprint identification), for example but not limited thereto. In some embodiments, the functional display region R10 may be designed with a low pixel density to reduce the influence of diffraction on the sensing device, but not limited thereto.

The buffer region R12 is located between the functional display region R10 and the general display region R14. The buffer region R12 is, for example, a wiring region or referred to as a winding region. Lengths of signal lines and/or dummy conductive patterns are changed through a winding design, accordingly adjusting the resistance or capacitance of different signal lines to improve load unevenness between different signal lines. In the disclosure, the term "load" may refer to the capacitance and/or resistance of the element, but the disclosure is not limited thereto.

The buffer region R12 may not only serve as a winding region, but also serve for displaying. In some embodiments, the buffer region R12 and the functional display region R10 may have the same resolution, or the buffer region R12 and the general display region R14 have the same resolution, but not limited thereto. In some embodiments, the buffer region R12 and the functional display region R10 may adopt the same pixel design. For example, each of the buffer region R12 and the functional display region R10 may include a plurality of color sub-pixels (e.g., a red sub-pixel R, a green sub-pixel G, and a blue sub-pixel B) for full-color display. In some embodiments, each of the buffer region R12 and the functional display region R10 may also include a plurality of white sub-pixels. The white sub-pixel may be regarded as a transparent region to allowing external light to penetrate the white sub-pixel and reach the sensing device when the sensing device is in the sensing mode (e.g., when the sensing device is sensing and/or acquiring an external image). The winding design may be disposed in the white sub-pixel of the buffer region R12, and the white sub-pixel provided with the winding design may be shielded by a light-shielding layer (e.g., a black matrix; not shown) to reduce the influence of the winding design on the visual effect, but not limited thereto. In some other embodiments, the resolution of the buffer region R12 may be lower than the resolution of the general display region R14, but the disclosure is not limited thereto.

The general display region R14 serves for displaying. In some embodiments, the general display region R14 may be designed with a high pixel density. In this design, the resolution of the general display region R14 may be higher than the resolution of the functional display region R10, but not limited thereto. In other embodiments, the resolution of the general display region R14 may be the same as or similar to the resolution of the functional display region R10.

In some embodiments, the overlapping region between the display panel 1 and the sensing device in plan view may be defined as the functional display region R10. The parts other than the functional display region R10 may include the general display region R14 and the buffer region R12. The general display region R14 may be, for example, a region including sub-pixels emitting light of different colors and not including white sub-pixels. The region between the general display region R14 and the functional display region R10 is the buffer region R12. Nonetheless, the disclosure is not limited thereto.

In some other embodiments, the overlapping region between the display panel 1 and the sensing device in plan view may be defined as the functional display region R10. The parts other than the functional display region R10 may include the general display region R14 and the buffer region R12. It is possible that the functional display region R10 and the buffer region R12 do not include white sub-pixels. The pixel density of sub-pixels of the functional display region R10 may be less than the pixel density of sub-pixels of the general display region R14. The region between the general display region R14 and the functional display region R10 is the buffer region R12. The pixel density of sub-pixels of the buffer region R12 may be substantially the same as the pixel density of sub-pixels of the functional display region. Nonetheless, the disclosure is not limited thereto. For example, the term "pixel density of sub-pixels" refers to the number of sub-pixels or sub-pixel electrodes included within a predetermined range in the functional display region R10, or the number of sub-pixels or sub-pixel electrodes included within the same predetermined range in the general display region R14, but not limited thereto. For example, the predetermined range in this embodiment is the area of the functional display region. Alternatively, in some other embodiments, a predetermined range of 3 mm*3 mm is selected in the functional display region and a predetermined range of 3 mm*3 mm is similarly selected in the general display region. Alternatively, any suitable range, such as 1 mm*1 mm, 5 mm*5 mm, and so on, may be selected as the predetermined range. Nonetheless, the disclosure is not limited thereto.

The peripheral region R16 may surround the general display region R14. The peripheral region R16 may be configured for disposing circuits, electronic components, or the like, but not limited thereto.

The outer pin bonding region R18 is disposed on one side of the general display region R14. The outer pin bonding region R18 may be configured to be bonded with an external chip or a driving circuit.

In the disclosure, each of the functional display region R10, the buffer region R12, the general display region R14, the peripheral region R16, and the outer pin bonding region R18 may include layer stacks and film layers in the respective region of the display panel 1 in plan view (e.g., a third direction D3), but the disclosure is not limited thereto.

With reference to FIG. 2, the display panel 1 may also include a first signal line 11 and a first dummy conductive pattern 12. FIG. 2 schematically shows one first signal line 11 and two first dummy conductive patterns 12. Nonetheless, it should be understood that the number of the first signal lines 11, the number of the first dummy conductive patterns 12, or the number of the first dummy conductive patterns 12 corresponding to or overlapped with each first signal line 11 in the display panel 1 may be changed depending on the requirements.

The first signal line 11 is disposed on the substrate 10 and corresponds to the buffer region R12. Herein, the description that a certain element or pattern corresponds to a certain region refers to the case where the element or pattern is overlapped with the region in the third direction D3. In other words, the first signal line 11 is overlapped with the buffer region R12 in the third direction D3.

In some embodiments, as shown in FIG. 2, the first signal line 11 not only corresponds to the buffer region R12, but also corresponds to the functional display region R10 and the general display region R14. For example, the first signal line 11 is disposed across the functional display region R10, the buffer region R12, and the general display region R14 in a first direction D1, and the first signal line 11 is electrically connected to a plurality of sub-pixels (not shown) arranged in the functional display region R10, the buffer region R12, and the general display region R14 in the first direction D1. In this design, the first signal line 11 is a gate line, for example, and the first signal line 11 is electrically connected to a plurality of gates of a plurality of sub-pixels (not shown) arranged in the functional display region R10, the buffer region R12, and the general display region R14 in the first direction D1. In some embodiments, the first signal line 11 and the plurality of gates may be in the same layer, but not limited thereto. The first signal line 11 may be a transparent conductive layer or a non-transparent conductive layer. The first signal line 11 may be a single conductive layer or a stacked layer formed by stacking multiple conductive layers. For example, the material of the first signal line 11 may include a transparent conductive material (for example but not limited to, indium tin oxide, indium zinc oxide, indium oxide, zinc oxide, tin oxide, other suitable materials, or a combination thereof), a metal (for example but not limited to, aluminum, molybdenum, copper, silver, other suitable materials, or a combination thereof), or a combination thereof, but the disclosure is not limited thereto.

The first dummy conductive pattern 12 is disposed on the substrate 10 and corresponds to the buffer region R12. In this embodiment, dummy conductive patterns (including the first dummy conductive pattern 12) are not electrically connected to other elements or film layers. In some embodiments, dummy conductive patterns are not electrically connected to signal lines. The first dummy conductive pattern 12 may be a transparent conductive layer or a non-transparent conductive layer. The first dummy conductive pattern 12 may be a single conductive layer or a stacked layer formed by stacking multiple conductive layers. The material of the first dummy conductive pattern 12 may be the same as or similar to that of the first signal line 11, which will not be repeatedly described here.

The first dummy conductive pattern 12 is overlapped with a part of the first signal line 11, or the first dummy conductive pattern 12 is at least partially overlapped with the first signal line 11. For example, as shown in FIG. 2, it is possible that the first dummy conductive pattern 12 is located in the buffer region R12 and is not located in other regions, and the first dummy conductive pattern 12 is overlapped with the first signal line 11 located in the buffer region R12 and is not overlapped with the first signal line 11 located in other regions. In some other embodiments, the first dummy conductive pattern 12 may also be located in the general display region R14 and overlapped with the first signal line 11 located in the general display region R14, but the disclosure is not limited thereto.

In some embodiments, the first dummy conductive pattern 12 extends, for example, according to the part of the first signal line 11 (indicating the part of the first signal line 11 overlapped with the first dummy conductive pattern 12). In addition, the orthogonal projection of the first dummy conductive pattern 12 on the substrate 10 may fall within the orthogonal projection of the first signal line 11 on the substrate 10. For example, a line width W12 of the first dummy conductive pattern 12 may be less than or equal to a line width W11 of the first signal line 11, but not limited thereto. In another embodiment, the line width W12 of the first dummy conductive pattern 12 may be greater than the line width W11 of the first signal line 11, but not limited thereto. Moreover, an insulating layer (not shown in FIG. 2) may be disposed between the first dummy conductive pattern 12 and the first signal line 11 to electrically insulate the first dummy conductive pattern 12 from the first signal line 11. Under this structure, the first dummy conductive pattern 12, the insulating layer, and the first signal line 11 form a capacitor structure.

By changing the line width, length, or thickness of either of the first dummy conductive pattern 12 and the first signal line 11, changing the overlapping area between the first dummy conductive pattern 12 and the first signal line 11, or changing the thickness of the insulating layer, the load of the first signal line 11 may be adjusted so that the first signal line 11 and other signal lines (e.g., second signal line 13 and third signal line 15; described later) have the same or similar resistance and/or capacitance. The term "same or similar" described in the disclosure indicates a difference of less than or equal to ±10%.

Depending on different requirements, the display panel 1 may also include other elements or film layers. For example, the display panel 1 may also include a second signal line 13 and a second dummy conductive pattern 14. FIG. 2 schematically shows two second signal lines 13 and two second dummy conductive patterns 14. Nonetheless, it should be understood that the number of the second signal lines 13, the number of the second dummy conductive patterns 14, or the number of the second dummy conductive patterns 14 corresponding to or overlapped with each second signal line 13 in the display panel 1 may be changed depending on the requirements.

The second signal line 13 is disposed on the substrate 10. The second signal line 13 and the first signal line 11 may be in the same conductive layer. For example, the second signal line 13 corresponds to the buffer region R12 and the general display region R14, and the second signal line 13 is located outside the functional display region R10. In other words, it is possible that the second signal line 13 is not located in the functional display region R10.

In some embodiments, as shown in FIG. 2, the second signal line 13 may be a gate line. The second signal line 13 may be electrically connected to a plurality of gates of a plurality of sub-pixels (not shown) arranged in the buffer region R12 and the general display region R14 in the first direction D1. In FIG. 2, the second signal line 13 extends in the general display region R14 in the first direction D1, and the second signal line 13 may extend in the buffer region R12 in alternately the first direction D1 and a second direction D2. Nonetheless, it should be understood that the extension direction or the shape in plan view of the second signal line 13 in the buffer region R12 may be changed depending on the requirements. By changing the length of the second signal line 13 through a winding design WD of the second signal line 13 in the buffer region R12, the resistance of the second signal line 13 can be changed. For example, the resistance of the second signal line 13 may increase as the length of the second signal line 13 increases.

The second dummy conductive pattern 14 is disposed on the substrate 10. The second dummy conductive pattern 14 and the first dummy conductive pattern 12 may be in the same conductive layer. The second dummy conductive pattern 14 corresponds to the buffer region R12. The second dummy conductive pattern 14 is overlapped with a part of the second signal line 13. For example, as shown in FIG. 2, it is possible that the second dummy conductive pattern 14 is located in the buffer region R12 and is not located in other regions, and the second dummy conductive pattern 14 is overlapped with the second signal line 13 located in the buffer region R12 and is not overlapped with the second signal line 13 located in other regions. In some other embodiments, the second dummy conductive pattern 14 may also be located in the general display region R14 and overlapped with the second signal line 13 located in the general display region R14, but the disclosure is not limited thereto.

In some embodiments, the second dummy conductive pattern 14 extends, for example, according to the part of the second signal line 13 (indicating the part of the second signal line 13 overlapped with the second dummy conductive pattern 14). In addition, the orthogonal projection of the second dummy conductive pattern 14 on the substrate 10 may fall within the orthogonal projection of the second signal line 13 on the substrate 10. For example, a line width W14 of the second dummy conductive pattern 14 may be less than or equal to a line width W13 of the second signal line 13, but not limited thereto. In another embodiment, the line width W14 of the second dummy conductive pattern 14 may be greater than the line width W13 of the first signal line 11, but not limited thereto. Moreover, an insulating layer (not shown in FIG. 2) may be disposed between the second dummy conductive pattern 14 and the second signal line 13 to electrically insulate the second dummy conductive pattern 14 from the second signal line 13. Under this structure, the second dummy conductive pattern 14, the insulating layer, and the second signal line 13 form a capacitor structure.

By changing the line width, length, or thickness of either of the second dummy conductive pattern 14 and the second signal line 13, changing the overlapping area between the second dummy conductive pattern 14 and the second signal line 13, or changing the thickness of the insulating layer, the load of the second signal line 13 may be adjusted so that the second signal line 13 and other signal lines (e.g., first signal line 11 and third signal line 15; described later) have the same or similar load.

As shown in FIG. 2, the display panel 1 may also include a third signal line 15. FIG. 2 schematically shows two third signal lines 15. Nonetheless, it should be understood that the number of the third signal lines 15 in the display panel 1 may be changed depending on the requirements.

The third signal line 15 is disposed on the substrate 10. The third signal line 15, the second signal line 13, and the first signal line 11 may be in the same conductive layer. For example, the third signal line 15 corresponds to the general display region R14, and the third signal line 15 may be located outside the functional display region R10 and the buffer region R12. In other words, the third signal line 15 is not located in the functional display region R10 or the buffer region R12.

In some embodiments, as shown in FIG. 2, the third signal line 15 may be a gate line. The third signal line 15 may be electrically connected to a plurality of gates of a plurality of sub-pixels (not shown) arranged in the general display region R14 in the first direction D1.

In FIG. 2, by the winding design WD of the second signal line 13 in the buffer region R12, the length of the second signal line 13 may be increased. Accordingly, the first signal line 11, the second signal line 13, and the third signal line 15 have the same or similar resistance.

In other embodiments, by increasing the length of the signal line, reducing the width of the signal line, reducing the thickness of the signal line, or a combination of at least two of the above, the resistance of the signal line may be increased so that different signal lines have the same or similar resistance.

Under the structure where the resolution of the general display region R14 is higher than the resolution of the functional display region R10 and/or the resolution of the buffer region R12, the number of pixels electrically connected to the third signal line 15 is greater than the number of pixels electrically connected to the first signal line 11, and the number of pixels electrically connected to the first signal line 11 is greater than the number of pixels electrically connected to the second signal line 13. By disposing the first dummy conductive pattern 12 and the second dummy conductive pattern 14, the capacitance of the first signal line 11 and the capacitance of the second signal line 13 may be increased. In addition, the increase in capacitance of the second signal line 13 may be greater than the increase in capacitance of the first signal line 11 by making the first dummy conductive pattern 12 and the second dummy conductive pattern 14 have different lengths. For example, a winding design WD similar to that of the second signal line 13 may be adopted for the second dummy conductive pattern 14 so that the second dummy conductive pattern 14 is longer than the first dummy conductive pattern 12. Accordingly, the first signal line 11, the second signal line 13, and the third signal line 15 have the same or similar capacitance. Moreover, by increasing the length of the second signal line 13 (e.g., by the winding design WD), the resistance of the second signal line 13 may be increased, so that different signal lines have the same or similar resistance.

In other embodiments, by increasing the overlapping area between the signal line and the dummy conductive pattern, reducing the thickness of the insulating layer between the signal line and the dummy conductive pattern, or a combination thereof, the capacitance of the signal line may be increased so that different signal lines have the same or similar capacitance.

By the above-mentioned design for compensating resistance and capacitance, the load unevenness between different signal lines (e.g., the first signal line 11, the second signal line 13, and the third signal line 15) can be improved, thus improving the display quality of the display panel 1.

With reference to FIG. 3, the main differences between a display panel 1A and the display panel 1 in FIG. 2 are described below. In the display panel 1A, the buffer region R12 surrounds the functional display region R10. The second signal line 13 includes a first portion P1, a second portion P2, and a third portion P3. The first portion P1 and the second portion P2 are respectively located on opposite sides (e.g., a left side and a right side) of the functional display region R10, and the third portion P3 is electrically connected to the first portion P1 and the second portion P2 from a third side (e.g., an upper side or a lower side) of the functional display region R10. Under this structure, the length of the second signal line 13 is greater than the length of the first signal line 11 and the length of the third signal line 15. Accordingly, by increasing the width of at least a part of the second signal line 13, the first signal line 11, the second signal line 13, and the third signal line 15 may have the same or similar resistance. For example, a width WP3 of the third portion P3 may be greater than a width WP1 of the first portion P1 and a width WP2 of the second portion P2, but not limited thereto.

FIG. 3 schematically shows one of relative arrangement relationships between the second dummy conductive pattern 14 and the second signal line 13. Nonetheless, it should be understood that parameters, such as the respective numbers, wiring manners, or shapes of the second signal line 13 and the second dummy conductive pattern 14, the overlapping area between the second signal line 13 and the second dummy conductive pattern 14, or the like, may be changed depending on the requirements, or may be the same as in the above-mentioned embodiments, which will not be repeatedly described here.

With reference to FIG. 4, the main differences between a display panel 1B and the display panel 1 in FIG. 2 are described below. In the display panel 1B, the first signal line 11 is broken into two portions in the functional display region R10, and the third signal line 15 is broken into two portions in the general display region R14, to reduce the difference between resistances of the first signal line 11, the second signal line 13, and the third signal line 15. Under this structure, by the above-mentioned design for compensating resistance and capacitance, the load unevenness between different signal lines (e.g., the first signal line 11, the second signal line 13, and the third signal line 15) can also be improved, thus improving the display quality of the display panel 1B.

With reference to FIG. 5A and FIG. 5B, FIG. 5A and FIG. 5B respectively show active elements that are electrically connected to the first signal line 11 (or to the second signal line 13) and to the third signal line 15. In some embodiments, the active elements may include a gate GE, a channel layer CH, a source SE, and a drain DE, but not limited thereto. In some embodiments, the gate GE, the first signal line 11, the second signal line 13, and the third signal line 15 may be in the same layer, while the source SE, the drain DE, the first dummy conductive pattern 12, and the second dummy conductive pattern 14 may be in the same layer, but not limited thereto.

To be specific, the gate GE, the first signal line 11, the second signal line 13, and the third signal line 15 are disposed on the substrate 10. An insulating layer (not shown) is disposed on the substrate 10 and covers the gate GE, the first signal line 11, the second signal line 13, and the third signal line 15. The source SE, the drain DE, the first dummy conductive pattern 12, and the second dummy conductive pattern 14 are disposed on the insulating layer. The first dummy conductive pattern 12 and the second dummy conductive pattern 14 are electrically insulated respectively from the first signal line 11 and the second signal line 13 by the insulating layer. In other words, the insulating layer may be disposed between the gate GE, the first signal line 11, the second signal line 13, and the third signal line 15 on one side, and the source SE, the drain DE, the first dummy conductive pattern 12, and the second dummy conductive pattern 14 on the other side.

In some embodiments, by reducing the width of the signal line, the resistance of the signal line may be increased. For example, as shown in FIG. 5A and FIG. 5B, the width W11 of at least a part of the first signal line 11 and the width W13 of at least a part of the second signal line 13 may be less than a width W15 of the third signal line 15 or a width WGE of the gate GE.

In some embodiments, by reducing the thickness of the signal line, the resistance of the signal line may be increased. For example, the thickness of the first signal line 11 and the thickness of the second signal line 13 may be less than the thickness of the third signal line 15.

In some embodiments, by increasing the overlapping area between the signal line and the conductive pattern (e.g., the dummy conductive pattern, the source SE, or the drain DE) thereon, the capacitance of the signal line may be increased. For example, as shown in FIG. 5A and FIG. 5B, the drain DE may be further extended to the above of the first signal line 11 and/or the second signal line 13 so that the first signal line 11 and/or the second signal line 13 are/is overlapped with the drain DE in the third direction D3. On the other hand, it is possible that the third signal line 15 is not overlapped with the drain DE in the third direction D3, or the overlapping area between the third signal line 15 and the drain DE in the third direction D3 is smaller than the overlapping area between the first signal line 11 and the drain DE in the third direction D3 and/or the overlapping area between the second signal line 13 and the drain DE in the third direction D3. In some embodiments, by increasing the width of the conductive pattern on the signal line, the overlapping area between the signal line and the conductive pattern thereon may be increased, accordingly increasing the capacitance of the signal line. In some other embodiments, the width or area of the source SE in FIG. 5A may also be increased, thus increasing the overlapping area between the source SE and the first signal line 11 in the third direction D3 and/or the overlapping area between the source SE and the second signal line 13 in the third direction D3. Accordingly, the capacitance of the first signal line 11 and/or the second signal line 13 is increased, so that the first signal line 11, the second signal line 13, and the third signal line 15 have the same or similar capacitance.

In some embodiments, by reducing the thickness of the insulating layer between the signal line and the conductive pattern thereon, the capacitance of the signal line may be increased. For example, the thickness of the insulating layer between the third signal line 15 and the source SE and/or the thickness of the insulating layer between the third signal line 15 and the drain DE may be greater than the thickness of the insulating layer between the first signal line 11 (or the second signal line 13) and the first dummy conductive layer 12 (or the second dummy conductive layer 14). In other words, the minimum distance between the third signal line 15 and the source SE and/or the minimum distance between the third signal line 15 and the drain DE in the third direction D3 may be greater than the minimum distance between the first signal line 11 (or the second signal line 13) and the first dummy conductive layer 12 (or the second dummy conductive layer 14) in the third direction D3.

With reference to FIG. 6A and FIG. 6B, in FIG. 6A, for convenience in labeling loads (e.g., a load RC1 to a load RC6) of different signal lines, the illustration of the first dummy conductive pattern and the second dummy conductive pattern is omitted. Reference may be made to FIG. 3 for the description of the dummy conductive patterns, which will not be repeated here.

The main differences between a display panel 1C and the display panel 1A in FIG. 3 are described below. In the display panel 1C, a plurality of sub-pixels in the odd and even horizontal rows respectively receive signals output by a driving circuit (not shown) disposed on the left and right sides of the general display region R14 through a plurality of signal lines arranged in the second direction D2. In addition, the first signal line 11 in the functional display region R10 is made of, for example, a transparent conductive material (e.g., metal oxide; represented by a thick line in FIG. 6A), so that the functional display region R10 has a high transmittance. Since the resistance value of the transparent conductive material is greater than that of the metal material, the load RC5 of the first signal line 11 in the functional display region R10 is increased. Under this structure, the display panel 1C may further include a logic gate 17. The logic gate 17 is disposed on the substrate 10 and corresponds to the buffer region R12. The logic gate 17 is electrically connected to the first signal line 11 to reduce the influence of the functional display region R10 on the first signal line 11 in other regions (e.g., the general display region R14). In some embodiments, a part of the first signal line 11 located between the functional display region R10 and the logic gate 17 and corresponding to the buffer region R12 may also be made of a transparent conductive material, but the disclosure is not limited thereto.

In some embodiments, as shown in FIG. 6A, the logic gate 17 includes, for example, two sets of inverters 170 connected to each other, and the first signal line 11 is, for example, a gate line. Specifically, after a signal is output by a driving circuit (not shown) to control the logic gate 17, a signal is output by the logic gate 17 to control the rear section of the first signal line 11. The voltage source level of the logic gate 17 comes from other signal lines on the panel. In other words, the logic gate 17 may disconnect the loads (e.g., the load RC4 and the load RC5) before and after the first signal line 11. Therefore, the influence of the load RC5 in the functional display region R10 on the signal transmission of the first signal line 11 in the general display region R14 can be reduced to uniform the display picture.

In some embodiments, the load of either of the first signal line 11 and the second signal line 13 may be increased by the winding design WD in the buffer region R12, so that the load RC4, the load RC6, and the sum of the load RC1 to the load RC3 are the same or similar.

In some embodiments, as shown in the right half of FIG. 6B, the winding design WD may be disposed outside the color sub-pixels (e.g., the red sub-pixel R, the green sub-pixel G, and the blue sub-pixel B) of the buffer region R12. For example, the winding design WD may be disposed in the white sub-pixel W of the buffer region R12 to reduce the shielding rate of the winding design WD to the color sub-pixels. In some embodiments, the white sub-pixel W overlapped with the winding design WD may be shielded by a light-shielding layer (e.g., a black matrix; not shown) to reduce the influence of the winding design WD on the visual effect. Alternatively, switching between bright and dark states of the white sub-pixel W (e.g., exhibiting the white sub-pixel W overlapped with the winding design WD in the dark state) may be utilized to reduce the influence of the winding design WD on the visual effect. As such, it is possible that the white sub-pixel W overlapped with the winding design WD is not shielded by the light-shielding layer. Although FIG. 6B is exemplified with the winding design WD of the first signal line 11, it should be understood that the design above may also be adopted for the winding design WD of the second signal line 13 in any embodiment of the disclosure, which will not be repeatedly described below.

In some embodiments, as shown in the left half of FIG. 6B, the logic gate 17 may also be disposed outside the color sub-pixels (e.g., the red sub-pixel R, the green sub-pixel G, and the blue sub-pixel B) of the buffer region R12. In addition, the white sub-pixel W overlapped with the logic gate 17 may be shielded by a light-shielding layer (e.g., a black matrix; not shown), or switching between bright and dark states of the white sub-pixel W may be utilized, to reduce the influence of the logic gate 17 on the visual effect.

With reference to FIG. 7, in FIG. 7, for convenience in labeling loads (e.g., a load RC1' to a load RC6') of different signal lines, the illustration of the first dummy conductive pattern and the second dummy conductive pattern is omitted. Reference may be made to FIG. 4 for the description of the dummy conductive patterns, which will not be repeated here. In addition, reference may be made to the content of FIG. 6B for the region R1 of FIG. 7, which will not be repeatedly described here.

The main differences between a display panel 1D and the display panel 1B in FIG. 4 are described below. In the display panel 1D, the first signal line 11 in the functional display region R10 is made of, for example, a transparent conductive material (e.g., metal oxide; represented by a thick line in FIG. 7), so that the functional display region R10 has a high transmittance. Since the resistance value of the transparent conductive material is greater than that of the metal material, the load RC5' of the first signal line 11 in the functional display region R10 is increased. Under this structure, the display panel 1D may further include the logic gate 17. The logic gate 17 is disposed on the substrate 10 and corresponds to the buffer region R12. The logic gate 17 is electrically connected to the first signal line 11.

It should be understood that in FIG. 6A, a plurality of sub-pixels located in the same horizontal row (arranged in the first direction DO are supplied with signals collectively by one first signal line 11. Therefore, the two sets of inverters 170 (the logic gate 17) electrically connected to the one first signal line 11 in FIG. 6A are in the same direction. On the other hand, in FIG. 7, a plurality of sub-pixels located in the same horizontal row (arranged in the first direction DO are supplied with signals by respectively two first signal lines 11. For example, a plurality of sub-pixels located on the left side of the display panel 1D in the horizontal row are supplied with signals by the first signal line 11 on the left side, while a plurality of sub-pixels located on the right side of the display panel 1D in the horizontal row are supplied with signals by the first signal line 11 on the right side. Therefore, the two sets of inverters 170 (the logic gate 17) electrically connected to the two first signal lines 11 in FIG. 7 are in opposite directions. In some other embodiments, the two first signal lines 11 of the plurality of sub-pixels located in the same horizontal row (arranged in the first direction DO may also be electrically connected, but the disclosure is not limited thereto.

In some embodiments, the load of either of the first signal line 11 and the second signal line 13 may be increased by the winding design WD in the buffer region R12, so that the load RC1', the load RC4', and the load RC6' are the same or similar.

With reference to FIG. 8A to FIG. 8C, in FIG. 8A, for convenience in labeling loads (e.g., a load RC1" to a load RC6") of different signal lines, the illustration of the first dummy conductive pattern and the second dummy conductive pattern is omitted. Reference may be made to FIG. 4 for the description of the dummy conductive patterns.

The main differences between a display panel 1E and the display panel 1D in FIG. 7 are described below. In the display panel 1E, the first signal line 11, the second signal line 13, and the third signal line 15 are each a data line, for example. To be specific, the first signal line 11, the second signal line 13, and the third signal line 15 each extend in the second direction D2, for example, and are each electrically connected to a plurality of sources (not shown in FIG. 8A to FIG. 8C) of a plurality of sub-pixels (not shown) arranged in the second direction D2.

As shown in FIG. 8A, when the first signal line 11 in the functional display region R10 is made of a transparent conductive material (e.g., metal oxide; represented by a thick line in FIG. 8A), the display panel 1E may further include the logic gate 17 to alleviate the increased response time (charging rise time Tr/charging fall time Tf) or the insufficiently charged general display region R14 caused by the increased load RC5".

In some embodiments, the logic gate 17 may be a transmission gate circuit. The transmission gate circuit may include a p-type metal-oxide-semiconductor (PMOS) field-effect transistor, an n-type metal-oxide-semiconductor (NMOS) field-effect transistor, or a combination thereof, but not limited thereto. In some embodiments, the transmission gate circuit may include one or more PMOS field-effect transistors. In some other embodiments, the transmission gate circuit may include one or more NMOS field-effect transistors. Nonetheless, the disclosure is not limited thereto. For example, when the gate signal passes through the pixels in the functional display region, the transmission gate circuit is turned on. When the gate signal passes through the pixels outside the functional display region, the transmission gate circuit is turned off, and the load of the data line is reduced, to reduce the charging rise time Tr and/or the charging fall time Tf of the data line. When the transmission gate circuit is turned off, the loads (e.g., the load RC4" and the load RC5") of the signal lines at both ends of the transmission gate circuit may be separated to uniform the display picture. In an embodiment, since the data line provides different data voltages to display different grayscales, logic gates different from those in FIG. 6A and FIG. 7 may be selected, but the disclosure is not limited thereto.

In some embodiments, the display panel 1E may further include a driving circuit 18 and a lead wire 19. The driving circuit 18 is configured to provide signals to the logic gate 17. In some embodiments, the driving circuit 18 may be disposed on a side of the functional display region R10 away from the outer pin bonding region R18 (see FIG. 1), but not limited thereto. The lead wire 19 is connected between the input terminal of the logic gate 17 and the driving circuit 18 and between the output terminal of the logic gate 17 and the driving circuit 18.

In some embodiments, by the above-mentioned design for compensating resistance and capacitance, the load unevenness between different signal lines (e.g., the first signal line 11, the second signal line 13, and the third signal line 15) can be improved, thus improving the display quality of the display panel 1E. For example, in FIG. 8A, since the transmission gate circuit (the logic gate 17) disconnects the load RC4" and the load RC5", as shown in FIG. 8C, the resistance of the first signal line 11 corresponding to the load RC4" may be increased by the winding design WD. In addition, in some embodiments, under the structure where the resolution of the general display region R14 is higher than the resolution of the functional display region R10 and/or the resolution of the buffer region R12, the number of pixels electrically connected to the third signal line 15 is greater than the number of pixels electrically connected to the first signal line 11 and/or to the second signal line 13. As shown in FIG. 8B and FIG. 8C, by disposing the first dummy conductive pattern 12 and the second dummy conductive pattern 14, the capacitance of different signal lines may also be compensated. As such, the load RC1", the load RC4", and the load RC6" may be the same or similar.

With reference to FIG. 9, the main differences between a display panel 1F and the display panel 1E in FIG. 8A are described below. In the display panel 1F, for example, a first signal line 11' is broken into two portions, such as a first portion 11A and a second portion 11B. The first portion 11A corresponds to the functional display region R10 and the buffer region R12, and the second portion 11B corresponds to the general display region R14. It is possible that the display panel 1F further includes a transmission gate circuit 17-1 and a transmission gate circuit 17-2, and does not include the logic gate 17 in FIG. 8A. The transmission gate circuit 17-1 and the transmission gate circuit 17-2 are disposed on the substrate 10 and correspond to the peripheral region R16. The transmission gate circuit 17-1 is electrically connected to the first portion 11A of the first signal line 11' through the lead wire 19, and the transmission gate circuit 17-2 is electrically connected to the second portion 11B of the first signal line 11' through the lead wire 19. In this embodiment, the first signal line 11' may be, for example, a data line.

Under high-frequency driving, the charging time of pixels is short, and the low pixel density design in the functional display region R10 results in a relatively great charging capacitance of the pixels in the functional display region R10, and in turn results in a relatively long charging rise time Tr or charging fall time Tf for the data line. Two transmission gate circuits are utilized to respectively supply data signals to the first portion 11A and the second portion 11B of the first signal line 11'. Specifically, when the transmission gate circuit 17-2 is turned off and the transmission gate circuit 17-1 is turned on, data signals may be supplied via the first portion 11A of the first signal line 11' to charge the pixels in the functional display region R10. When the transmission gate circuit 17-2 is turned on and the transmission gate circuit 17-1 is turned off, data signals may be supplied via the second portion 11B of the first signal line 11' to charge the pixels in the general display region R14. As such, the load can be reduced when data signals are supplied. In addition, since the second portion 11B of the first signal line 11' does not have the load of the functional display region R10, the above-mentioned winding design may also be adopted for the second portion 11B of the first signal line 11' to improve the load unevenness between different signal lines. In some embodiments, as shown in FIG. 9, the pixels in the buffer region R12 are electrically connected to the first portion 11A of the first signal line 11'. Nonetheless, in other embodiments, the pixels in the buffer region R12 may be electrically connected to the second portion 11B of the first signal line 11'.

Another thing to mention is that, in any one of the embodiments of the disclosure, the long side of the pixels may be parallel to the first direction D1 or the second direction D2, which is not limited herein. In some embodiments, a design where the long side of the pixels are parallel to the second direction D2 may be adopted to have a narrow border, but not limited thereto.

In summary of the foregoing, in the embodiments of the disclosure, the load can be compensated by the buffer region to improve the load unevenness between different signal lines, thus improving the display quality of the display panel.

Although the embodiments and the advantages thereof have been disclosed as above, it should be understood that, a person skilled in the art may make variations, replacements, and modifications, and features among the embodiments may be arbitrarily mixed and replaced with each other into other newly formed embodiments without departing from the spirit and scope of the disclosure. In addition, the protection scope of the disclosure is not limited to the process, machine, manufacture, composition of matters, device, method, or step in the specifically described embodiments in the specification. A person skilled in the art can understand from the content of the disclosure that the existing or to-be-developed process, machine, manufacture, composition of matters, device, method, or step may be used according to the disclosure as long as the substantially same function can be implemented or the substantially same result can be obtained in the embodiments described herein. Therefore, the protection scope of the disclosure includes the above-mentioned process, machine, manufacture, composition of matters, device, method, or step. Moreover, each claim forms an independent embodiment, and the protection scope of the disclosure also includes a combination of each of the claims and embodiments. The protection scope of the disclosure should be subject to the appended claims.

What is claimed is:

1. A display panel comprising:
   a substrate comprising a functional display region, a buffer region, and a general display region, wherein the buffer region is located between the functional display region and the general display region;
   a first signal line disposed on the substrate and corresponding to the buffer region; and
   a first dummy conductive pattern disposed on the substrate and corresponding to the buffer region, wherein the first dummy conductive pattern is overlapped with a part of the first signal line.

2. The display panel according to claim 1, further comprising:
   a logic gate disposed on the substrate and corresponding to the buffer region, wherein the logic gate is electrically connected to the first signal line.

3. The display panel according to claim 2, wherein the logic gate comprises an inverter, and the first signal line comprises a gate line.

4. The display panel according to claim 2, wherein the logic gate comprises a transmission gate circuit, and the first signal line comprises a data line.

5. The display panel according to claim 4, wherein the transmission gate circuit comprises a p-type metal-oxide-semiconductor field-effect transistor, an n-type metal-oxide-semiconductor field-effect transistor, or a combination thereof.

6. The display panel according to claim 1, wherein the substrate further comprises a peripheral region, wherein the peripheral region surrounds the general display region, and the display panel further comprises:
a transmission gate circuit disposed on the substrate and corresponding to the peripheral region, wherein the transmission gate circuit is electrically connected to the first signal line.

7. The display panel according to claim 6, wherein the first signal line comprises a data line.

8. The display panel according to claim 1, wherein the first dummy conductive pattern extends according to the part of the first signal line.

9. The display panel according to claim 1, wherein the first signal line further corresponds to the functional display region and the general display region, and the display panel further comprises:
a second signal line disposed on the substrate and corresponding to the buffer region and the general display region; and
a second dummy conductive pattern disposed on the substrate and corresponding to the buffer region, wherein the second dummy conductive pattern is overlapped with a part of the second signal line.

10. The display panel according to claim 9, wherein the second dummy conductive pattern extends according to the part of the second signal line, and the second dummy conductive pattern and the first dummy conductive pattern have different lengths.

11. A display apparatus comprising:
a display panel comprising:
a substrate comprising a functional display region, a buffer region, and a general display region, wherein the buffer region is located between the functional display region and the general display region;
a first signal line disposed on the substrate and corresponding to the buffer region; and
a first dummy conductive pattern disposed on the substrate and corresponding to the buffer region, wherein the first dummy conductive pattern is overlapped with a part of the first signal line; and
a sensing device overlapped with the functional display region.

12. The display apparatus according to claim 11, wherein the display panel further comprises:
a logic gate disposed on the substrate and corresponding to the buffer region, wherein the logic gate is electrically connected to the first signal line.

13. The display apparatus according to claim 12, wherein the logic gate comprises an inverter, and the first signal line comprises a gate line.

14. The display apparatus according to claim 12, wherein the logic gate comprises a transmission gate circuit, and the first signal line comprises a data line.

15. The display apparatus according to claim 14, wherein the transmission gate circuit comprises a p-type metal-oxide-semiconductor field-effect transistor, an n-type metal-oxide-semiconductor field-effect transistor, or a combination thereof.

16. The display apparatus according to claim 11, wherein the substrate further comprises a peripheral region, wherein the peripheral region surrounds the general display region, and the display panel further comprises:
a transmission gate circuit disposed on the substrate and corresponding to the peripheral region, wherein the transmission gate circuit is electrically connected to the first signal line.

17. The display apparatus according to claim 16, wherein the first signal line comprises a data line.

18. The display apparatus according to claim 11, wherein the first dummy conductive pattern extends according to the part of the first signal line.

19. The display apparatus according to claim 11, wherein the first signal line further corresponds to the functional display region and the general display region, and the display panel further comprises:
a second signal line disposed on the substrate and corresponding to the buffer region and the general display region; and
a second dummy conductive pattern disposed on the substrate and corresponding to the buffer region, wherein the second dummy conductive pattern is overlapped with a part of the second signal line.

20. The display apparatus according to claim 19, wherein the second dummy conductive pattern extends according to the part of the second signal line, and the second dummy conductive pattern and the first dummy conductive pattern have different lengths.

* * * * *